United States Patent [19]

Lee et al.

[11] Patent Number: 4,910,167
[45] Date of Patent: Mar. 20, 1990

[54] III-V SEMICONDUCTOR GROWTH INITIATION ON SILICON USING TMG AND TEG

[75] Inventors: Jhang W. Lee, Mansfield; Richard E. McCullough, Wrentham; Jack P. Salerno, Waban, all of Mass.

[73] Assignee: Kopin Corporation, Taunton, Mass.

[21] Appl. No.: 120,023

[22] Filed: Nov. 13, 1987

[51] Int. Cl.$^4$ ............... H01L 21/203; H01L 21/205; H01L 21/365
[52] U.S. Cl. .................. 437/132; 148/DIG. 65; 148/DIG. 72; 148/DIG. 110; 148/DIG. 169; 148/DIG. 149; 156/612; 156/613; 437/107; 437/111; 437/112; 437/946; 437/939; 437/970; 437/976
[58] Field of Search ............... 148/DIG. 29, 56, 65, 148/72, 97, 110, 149, 169; 156/610–614; 437/107, 111, 112, 946, 939, 970, 976

[56] References Cited
U.S. PATENT DOCUMENTS

| | | | |
|---|---|---|---|
| 4,146,774 | 3/1979 | Fraas | 437/107 |
| 4,330,360 | 5/1982 | Kubiak et al. | 156/610 |
| 4,699,688 | 10/1987 | Shastry | 156/606 |
| 4,756,792 | 7/1988 | Fujita et al. | 156/610 |

OTHER PUBLICATIONS

Tirtowidjojo et al., "Equilibrium Gas Phase Species for MOCUD of $Al_xGa_{1-x}As$", J. Cryst. Growth, vol. 77, (1986), pp. 200–209.
Smeets et al., "Influence of Alkyl Substituents of OMs and Operating Pressure . . . Grown by OMVPE", J. Cryst. Growth, vol. 77, (1986), 374–353.
McCrary et al., "The Ultraviolet . . . of Selected Organometallic Compounds Used in the Chemical Vapor Deposition of Gallium Arsenide", vol. 84, (1987), pp. 253–258.
Kuo et al., "OMVPE Growth of GaInAs", J. Cryst. Growth, vol. 64 (1983), pp. 461–470.
Weyers et al., "Intentional p-type Doping by Carbon in Metalorganic MBE of GaAs", J. Elect. Mat., vol. 15, No. 2, Mar. 1986, pp. 57–59.
Kuech et al., "The Influence of Growth Chemistry on the MOVPE Growth of GaAs . . . ", J. Cryst. Growth, vol. 77, (1986), pp. 257–271.
Putz et al., "A Comparative Study of $Ga(C_2H_5)_3$ and $Ga(CH_3)_3$ in the MOMBE of GaAs", J. Cryst. Growth, vol. 74, (1986), pp. 292–300.
Heinecke et al., "Selective Growth of GaAs in the MOMBE and MOCVD Systems", J. Cryst. Growth, vol. 77 (1986), pp. 303–309.
Mat. Res. Soc. Symp. Res., 91:105–111 (1987).
Mat. Res. Soc. Symp. Proc., 67:53–64 (1986).
Lee et al., Mat. Res. Soc. Symp. Proc., 91:33 (1987).
Harris et al., Mat. Res. Soc. Symp. Proc., 91:3 (1987).
"MOCVD Growth of InP on 4-inch Si Substrate with GaAs Intermediate Layer" by Seki et al., vol. 26, No. 10, Oct. 1987, pp. L1587–L1589.
Journal of Crystal Growth 77, by Vernon et al., 1986, pp. 530–538.
Appl. Phys. Lett. 44, by Kuo et al., Mar. 1, 1984, pp. 550–552.

Primary Examiner—Brian E. Hearn
Assistant Examiner—William Bunch
Attorney, Agent, or Firm—Hamilton, Brook, Smith & Reynolds

[57] ABSTRACT

A GaAs containing nucleation layer is deposited upon Si, Ge/Si, or other single crystal substrate from triethyl gallium (TEG). Deposition from TEG allows a lower deposition temperature which provides a low level of substrate contamination and improved surface morphology.

18 Claims, 2 Drawing Sheets

III-V SEMICONDUCTOR GROWTH INITIATION ON SILICON USING TMG AND TEG

BACKGROUND OF THE INVENTION

The growth of III-V material on Si has been recognized as a highly desirable technology goal for a number of years. The earliest work focused on gallium arsenide (GaAs) solar cells because they were very large area devices where the substrate cost, maximum substrate size, ruggedness and weight (for space applications) were major obstacles for conventional GaAs homoepitaxial approaches. Si substrates provided an attractive solution to all of the above problems. In addition, the alloy composition of AlGaAs can be adjusted to provide an optimum bandgap and absorption match to Si for high efficiency multiple bandgap solar cells. Early efforts attempted the growth of GaAs directly on both single and polycrystal Si, but with very little success. This was not a surprising result because of the expected heteroepitaxial problems created by a 4% lattice mismatch, large thermal expansion mismatch and polar/non-polar interface with antiphase disorder, cross doping and phase segregation. These initial efforts then evolved into a variety of approaches utilizing refractory metals, Ge or Si-Ge graded layers with subsequent growth of GaAs. These structures still faced the polar/non-polar interface problems. While reasonably efficient GaAs on Ge single crystal cells were realized, the results with various interfacial layers on Si were not too encouraging.

About 1981, the potential advantages of large-size wafers, optical interconnects, opto-electronic integrated circuits (OEIC) and monolithic integration of ultra-high speed GaAs with high density Si VLSI pushed a re-examination of the earlier difficulties of direct GaAs/Si heteroepitaxy. There were three key results which have greatly changed the outcome from the prior failures. First was the ability to achieve a clean (relatively O and C free) Si surface. Second was the separation of the nucleation and growth phases in the two-step growth process. Third was the role of tilting the substrate off the direct [100] orientation to form an array of even atomic layer steps in the Si surface to eliminate formation of anti-phase domains. The results of these breakthroughs have made GaAs or other III-V materials on Si increasingly promising from the device and IC perspective.

Recently, nearly all types of GaAs and other III-V heterojunction devices have been demonstrated in GaAs/Si by using molecular beam epitaxy (MBE) or organometallic chemical vapor deposition (OMCVD). For some applications, the device performances are comparable to conventional GaAs approaches, while for others, especially for optical devices, they are still inferior.

One problem encountered in the deposition of III-V material is the difficulty in preventing III-V/Si interfacial contamination during the formation of the nucleation layer. Another problem, particularly in the OMCVD process, is the rough surface morphology resulting from the relatively high substrate temperatures required to efficiently deposit the nucleation layer. Thus, a need exists for a method by which a gallium arsenide or phosphide-containing nucleation layer can be quickly deposited on a surface with the resulting device having a smooth surface morphology and a low level of impurities.

SUMMARY OF THE INVENTION

This invention is related to the formation of gallium arsenide- or phosphide-containing III-V layers upon silicon or other single crystal substrates by OMCVD methods. More particularly, the invention pertains to the relatively fast formation of a gallium arsenide-containing nucleation layer via deposition from triethyl gallium (TEG) and arsine ($AsH_3$) at low temperatures. The invention involves the steps of providing a clean GaAs/Si interface upon which a gallium arsenide layer is to be deposited. The substrate is heated and contacted with an atmosphere containing TEG and $AsH_3$. Deposition is allowed to continue until a gallium arsenide layer which covers substantially all of the substrate surface has been formed. The heat is then raised and the TEG is replaced by trimethyl gallium (TMG). Deposition continues under these conditions until a gallium arsenide layer of a desired thickness has been deposited.

This process provides a method by which gallium arsenide can be deposited upon substrates to yield a lower level of interface contamination and superior surface morphology than currently available. Furthermore, the process allows a faster deposition of a gallium arsenide nucleation layer at low substrate temperatures than previously known.

It should be noted that in the embodiments shown herein, GaAs or AlGaAs has been chosen to illustrate the process, but as mentioned above, other III-V compounds or alloys, such as InP, etc., may be substituted therefore or II-VI compounds, such as CdTe may be employed in place of III-V compounds.

DETAILED DESCRIPTION OF THE INVENTION

The ability to replace trimethyl gallium (TMG) with triethyl gallium (TEG) during formation of a gallium arsenide (GaAs) nucleation layer on a substrate offers greater processing speed even at low temperatures, improved surface morphology of the ultimate GaAs layer produced and reduction of interfacial contaminants within the finished devices. Production of a gallium arsenide layer upon a silicon substrate requires the step of producing a gallium arsenide nucleation layer upon the substrate surface. This nucleation layer serves as the GaAs/Si interface and provides a surface upon which the ultimate GaAs layer is anchored.

The nucleation layer is commonly deposited by organometallic chemical vapor deposition (OMCVD) from an atmosphere comprising TMG and arsine ($AsH_3$). This method has been found to be less than satisfactory, however, because deposition from TMG generally requires temperatures above 425° C., and at these temperatures, deposited gallium arsenide has difficulty properly wetting the substrate surface, this results in a morphology containing GaAs islands surrounded by areas of uncovered Si. When the temperature of deposition is lowered in an attempt to overcome these problems, the deposition rate drops to below 50 nm/hr, a rate far below that required to allow commercial production. Furthermore, at this slow growth rate, the impurity incorporation rate per GaAs volume is increased. This is because the impurity incorporation rate per time remains constant. The resulting effect is the generation of undesirable conduction channels and deep level traps at the GaAs/Si interface region. These conduction channels and traps reduce the overall effectiveness of the completed device.

When the TMG is replaced by TEG, however, a significantly different result is observed. The TEG allows a lower temperature deposition and a smoother morphology. Also, this provides a quicker coverage of exposed Si and a resultant decrease in the degree of unwanted impurities contained within the device.

Figure 1:
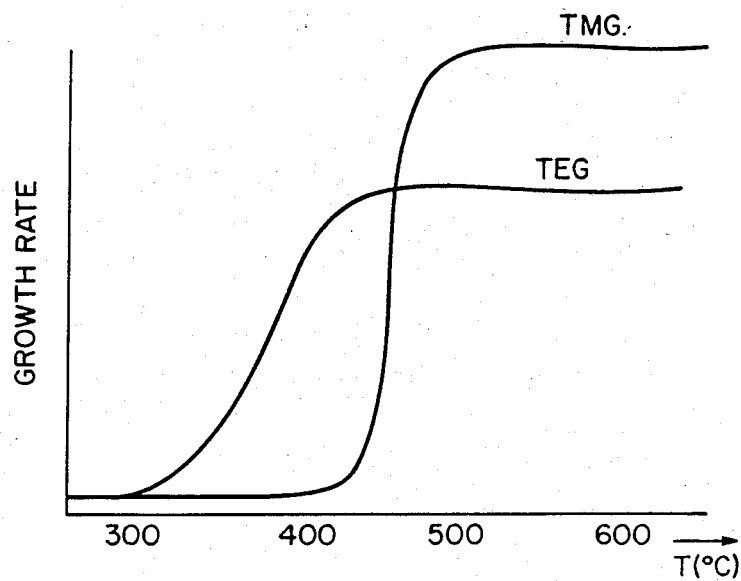
FIG. 1 is a plot of gallium arsenide growth rates via OMCVD versus substrate temperature for triethyl gallium and trimethyl gallium.

FIG. 1 is a representation of the deposition growth rates of GaAs versus deposition temperature for both TMG and TEG. As can be seen in FIG. 1, the growth rate of layers deposited from TEG is greater than that of layers deposited from TMG up to a temperature of about 450° C. Above approximately that temperature the deposition rate from TMG becomes greater than that from TEG. This effect suggests the following deposition protocol: Deposit a nucleation layer via OMCVD from TEG at low temperature to provide a smooth, quickly formed surface and then increase the temperature and replace the TEG with TMG to provide rapid deposition via OMCVD of the ultimate GaAs layer.

Figure 2:
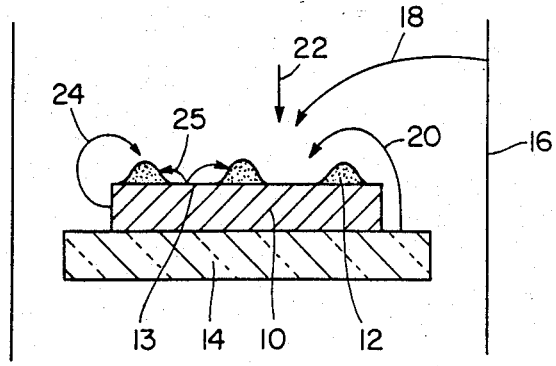
FIG. 2 is a schematic representation of the sources of contamination on the GaAs/Si interface during the formation of a gallium arsenide nucleation layer.

FIG. 2 illustrates the sources of contamination occurring during formation of the nucleation layer. In FIG. 2, a substrate 10 has a nucleation layer comprising a plurality of growing GaAs islands 12. Between the islands 12 are exposed substrate surfaces 13. The slower the GaAs islands 12 are grown, the longer the substrate surfaces 13 are exposed, and the more likely the interface region is to become contaminated. Sources of contamination include the substrate holder 14 with contaminants 20, the reaction chamber walls 16 with contaminants 18, the silicon substrate 10 itself acting as contaminants 24 and 25, and the reaction vapors with contaminants 22.

The level of contaminants tends to increase at the slow growth rate of gallium arsenide. This occurs because the level of contaminants present in the atmosphere surrounding the substrate is generally a constant. As such, the probability of a contaminant contacting any given part of the substrate surface is equal in any given period of time. A GaAs layer grown fast, therefore, has fewer contaminants. Furthermore, the fast coverage of the Si surface reduces the chance of Si migration from the exposed Si surface (contaminants 25 in FIG. 2). Also, for any contaminant contacting the surface, there is a greater chance that it will remain on the surface if it contacts silicon rather than gallium arsenide. The result of this effect is a greater concentration of contaminants in uncovered substrate regions than on gallium arsenide-covered regions.

It is therefore clear that the total contamination level can be reduced by minimizing the time that uncovered surfaces of the substrate are exposed to the reaction atmosphere. Since gallium arsenide deposition from TEG can be achieved at much lower temperatures than the same deposition from TMG, the TEG allows a greater gallium arsenide "wetting" of the substrate surface. As such, the substrate surface contains uncovered regions for a time much shorter than experienced with deposition from TMG. The shorter the substrate is exposed, the lower the level of impurities contained thereon and also the less migration of the impurities and Si itself onto the GaAs island surfaces.

Once the substrate surface is fully covered by a gallium arsenide layer, the temperature is raised and the TEG is replaced by TMG. This allows faster deposition of the ultimate layer produced. Since the nucleation layer has a generally smooth morphology, the TMG-deposited gallium arsenide layer upon the nucleation layer also exhibits a smooth morphology.

This method is not intended to be limited solely to gallium arsenide deposited upon silicon substrates. Rather, the same method can also be used to prepare AlGaAs, InGaAs InGaAsP and other combinations of (Al, Ga, In) (As, P) layers upon substrates of Si, Ge/Si or other single crystal substrates. While in each case, the nucleation layer is formed by deposition from TEG rather than TMG, the addition of trimethyl aluminum (TMA) or trimethyl indium (TMI) to the reaction atmosphere allows the deposition of the (Al, Ga, In) (As, P) compounds described above.

In addition, it is believed that triethyl indium (TEI) also has greater deposition rates than TMI at low substrate temperatures. This invention should also apply to grow In-based III-V compounds on Si.

The method of depositing gallium arsenide on silicon with a nucleation layer deposited from TEG can be carried out as follows:

A substrate upon which deposition will take place is thoroughly cleaned and placed in the reaction chamber. After an in-situ oxide cleaning at about 800° C. for several minutes, the temperature is lowered to between about 300° and 400° C., with a temperature of about 350° C. preferred. The reaction chamber is then flowed with an atmosphere containing TEG and AsH$_3$. Under these conditions, a gallium arsenide nucleation layer will form on the substrate at a deposition rate of about 100 to 400 nm/hr. The conditions are maintained and the gallium arsenide nucleation layer is allowed to grow to a desired level, preferably between about 10 and 20 nm. The growth of the nucleation layer occurs within a maximum time of 10 minutes, however, about 5 minutes is preferred. At this point, the substrate temperature is raised to between about 600° and 700° C., with a temperature of about 650° C. preferred. At this point, the TEG supply is closed, and the TMG supply is opened to allow TMG to flow through the reaction chamber. It is not necessary to flush the residual TEG from the reaction chamber, since its only effect will be to supplement gallium deposition until exhausted. Throughout this step, the supply of AsH$_3$ is continued to the reaction chamber. The substrate temperature and gas supplies are maintained until a GaAs layer of a desired thickness has been deposited upon the nucleation layer and thus, upon the substrate itself. At this point, further growth steps for the production of the ultimate GaAs device may be carried out.

Figure 3:
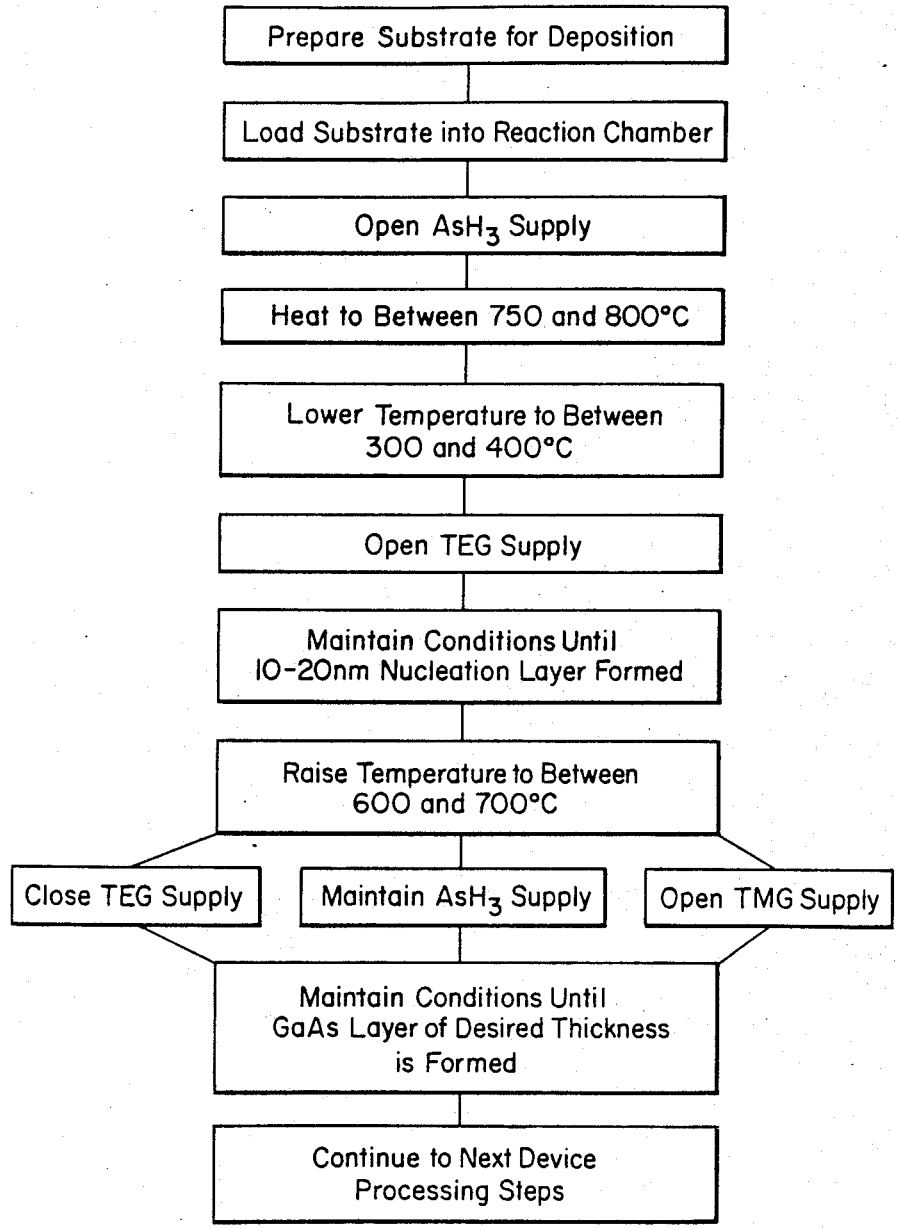
FIG. 3 is a flow chart outlining the process steps of one embodiment of the invention.

These process steps are outlined in the flowchart of FIG. 3 which may also involve additional growth of n- or p-type layers of (Al, Ga, In) (As, P).

Equivalents

Those skilled in the art will recognize, or be able to ascertain, using no more than routine experimentation, many equivalents to the specific embodiments described herein. Such equivalents are intended to be encompassed in the following claims.

We claim:

1. A process for depositing gallium arsenide- or phosphide-containing III-V materials upon Si, Si/Ge, or other single crystal substrates comprisings the steps of
   a. providing a substrate upon which a III-V material is to be deposited;
   b. exposing the substrate to an atmosphere which comprises triethyl gallium and a material selected from the group consisting of arsine, phosphine and combinations thereof while heating the substrate to a temperature at which a nucleation layer containing materials selected from the group consisting of gallium arsenide, gallium phosphide, and gallium arsenide phosphide will form upon the substrate surface;
   c. maintaining deposition under the triethyl gallium-containing atmosphere until the surface of the substrate is substantially covered with a nucleation layer;
   d. raising the temperature of the substrate to a temperature at which the III-V material can be deposited upon the nucleation layer while replacing the triethyl gallium with trimethyl gallium; and,
   e. maintaining deposition under the trimethyl gallium-containing atmosphere until a layer of III-V material of a desired thickness has been deposited.

2. A process as in claim 1 wherein the substrate is selected from the group consisting of Si, Ge/Si and other single crystal substrates.

3. A process as in claim 1 comprising the additional step of heating the substrate to about 800° C. in situ prior to exposing the substrate to the atmosphere containing triethyl gallium in order to clean the substrate surface.

4. A method in claim 1 wherein the nucleation layer is produced at a temperature of about 300° to about 400° C.

5. A method as in claim 1 wherein the nucleation layer is allowed to grow to a thickness of about 10 to about 20 nm.

6. A method as in claim 1 wherein once the nucleation layer has reached the desired thickness, the temperature is raised to between about 600° and about 700° C.

7. A method as in claim 1 wherein the trimethyl gallium-containing atmosphere further comprises material selected from the group consisting of aluminum and indium.

8. A process for depositing indium phosphide- or arsenide-containing III-V material upon Si, Si/Ge, or other single crystal substrates comprising the steps of
   a. providing a substrate upon which a III-V material is to be deposited;
   b. exposing the substrate to an atmosphere which comprises triethyl indium and a material selected from the group consisting of phosphine, arsine, and combinations thereof while heating the substrate to a temperature at which a nucleation layer containing materials selected from the group consisting of indium phosphide, indium arsenide, and indium phosphide arsenide will form upon the substrate surface;
   c. maintaining deposition under the triethyl indium-containing atmosphere until the surface of the substrate is substantially covered with a nucleation layer;
   d. raising the temperature of the substrate to a temperature at which the III-V material can be deposited upon the nucleation layer while replacing the triethyl indium with trimethyl indium; and
   e. maintaining the deposition under the trimethyl indium-containing atmosphere until a layer of III-V material of a desired thickness has been deposited.

9. A process for forming III-V material upon single crystal semiconductor substrates comprising the steps of:
   a. providing a substrate upon which a III-V material is to be deposited;
   b. exposing the substrate to an atmosphere comprising:
      i. a material selected from the group consisting of triethyl gallium, triethyl aluminum, triethyl indium and combinations thereof; and,
      ii. a material selected from the group consisting of arsine, phosphine and combinations thereof;
   c. maintaining exposure to the atmosphere for a time sufficient to form a nucleation layer of desired thickness;
   d. exposing the nucleation layer to a second atmosphere comprising a material of different chemical composition from those selectable in step (b)(i); and
   e. maintaining exposure to the second atmosphere under conditions at which a desired thickness of the III-V material is formed.

10. A process as in claim 9 wherein the substrate is selected from the group consisting of Si and Ge/Si.

11. A process as in claim 9 wherein the substrate is maintained at a temperature between about 300° and 400° C. during exposure to the atmosphere.

12. A process as in claim 9 wherein a nucleation layer of between about 10 and 20 nm is deposited.

13. A process for forming III-V materials upon semiconductor substrates comprising:
   providing a substrate upon which a III-V material is to be deposited;
   exposing the substrate to a first atmosphere at a first temperature;
   maintaining exposure to the first atmosphere for a time sufficient to form a nucleation layer;
   exposing the nucleation layer to a second atmosphere comprising a material of different chemical composition from the first atmosphere at a higher temperature than the first temperature; and
   maintaining exposure to the second atmosphere under conditions at which a desired thickness of the III-V material is formed.

14. The process of claim 13 wherein the first temperature is in a range between about 300° to about 400° C.

15. The process of claim 13 wherein the higher temperature is within a range between about 600° and about 700° C.

16. The process of claim 13 wherein the substrate is formed of material other than III-V material.

17. The process of claim 13 wherein the substrate is formed of Si.

18. The process of claim 13 wherein the substrate is formed if Ge.

* * * * *